(12) United States Patent
Suvorov

(10) Patent No.: US 8,853,065 B2
(45) Date of Patent: Oct. 7, 2014

(54) METHODS FOR FABRICATING SEMICONDUCTOR DEVICES HAVING REDUCED IMPLANT CONTAMINATION

(75) Inventor: Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 1230 days.

(21) Appl. No.: 11/434,854

(22) Filed: May 16, 2006

(65) Prior Publication Data

US 2007/0269966 A1 Nov. 22, 2007

(51) Int. Cl.
*H01L 21/425* (2006.01)
*H01L 21/265* (2006.01)

(52) U.S. Cl.
CPC .............................. *H01L 21/26546* (2013.01)
USPC .................................. 438/514; 257/E21.341

(58) Field of Classification Search
USPC ........................... 438/510, 514; 257/E21.341
See application file for complete search history.

(56) References Cited

U.S. PATENT DOCUMENTS

| 4,124,801 | A | * | 11/1978 | Cook et al. ..................... | 250/288 |
| 4,800,100 | A | * | 1/1989 | Herbots et al. ................. | 427/527 |
| 5,126,575 | A | * | 6/1992 | White ......................... | 250/492.3 |
| 5,350,926 | A | * | 9/1994 | White et al. .............. | 250/492.21 |
| 7,402,820 | B2 | * | 7/2008 | Low et al. ................ | 250/492.21 |
| 2004/0004184 | A1 | * | 1/2004 | Schubert ....................... | 250/284 |
| 2007/0241276 | A1 | * | 10/2007 | Low et al. ...................... | 250/282 |

OTHER PUBLICATIONS

Binari et al. "H, He, and N Implant Isolation of n-Type GaN", *J. Appl. Phys.* 78(5):3008-3011 (1995).
Burm et al. "Ultra-Low Resistive Ohmic Contacts on n-GaN Using Si Implantation", *Appl. Phys. Lett.* 70(4):464-466 (1997).
Haase et al. "Deep-Level Defects and n-Type-Carrier Concentration in Nitrogen Implanted GaN", *Appl. Phys. Lett.* 69(17):2525-2527 (1996).
Pearton et al. "Ion Implantation Doping and Isolation of GaN" *Appl. Phys. Lett.* 67(10):1435-1437 (1995).
Tan et al. "Damage to Epitaxial GaN Layers by Silicon Implantation" *Appl. Phys. Lett.* 69(16):2364-2366 (1996).
Zolper et al. "Electrical and Structural Analysis of High-Dose Si Implantation in GaN", *Appl. Phys. Lett.* 70(20):2729-2731 (1997).

* cited by examiner

*Primary Examiner* — Jarrett Stark
(74) *Attorney, Agent, or Firm* — Myers Bigel Sibley & Sajovec, PA

(57) ABSTRACT

A method of fabricating a semiconductor device includes selecting an element for implanting into a substrate. The element has at least a first isotope and a second isotope. At least one implant contaminant is identified as having a particle weight that is substantially identical to an atomic weight of the first isotope of the element. As such, ions of the second isotope of the element are selectively implanted into a region of the substrate. The second isotope has an atomic weight that is different from the particle weight of the at least one implant contaminant. For example, the selected element may be silicon (Si), the implant contaminant may be nitrogen ($N_2$), the first isotope having the substantially identical atomic weight may be silicon-28, and the second isotope having the different atomic weight may be silicon-29. Related methods, apparatus, and devices are also discussed.

12 Claims, 4 Drawing Sheets

METHODS FOR FABRICATING SEMICONDUCTOR DEVICES HAVING REDUCED IMPLANT CONTAMINATION

FIELD OF THE INVENTION

The present invention relates to semiconductor devices, and, more particularly, to methods and apparatus for fabricating semiconductor devices and related devices.

BACKGROUND OF THE INVENTION

Materials such as silicon (Si) and gallium arsenide (GaAs) have found wide application in semiconductor devices for lower power and, in the case of Si, lower frequency applications. However, these more familiar semiconductor materials may not be well suited for higher power and/or high frequency applications, for example, due to their relatively small bandgaps (e.g., 1.12 eV for Si and 1.42 for GaAs at room temperature) and/or relatively small breakdown voltages.

In light of the difficulties presented by Si and GaAs, wide bandgap semiconductor materials, such as silicon carbide (2.996 eV for alpha SiC at room temperature), and the Group III nitrides, including gallium nitride (e.g., 3.36 eV for GaN at room temperature), have been considered for use in high power, high temperature and/or high frequency applications and devices. These materials, typically, may have higher electric field breakdown strengths and higher electron saturation velocities as compared to gallium arsenide and/or silicon.

Ion implantation is a method for impurity doping in semiconductors where precise control of doping level and/or doping uniformity may be desired. A conventional ion implantation system may include an ion source configured to generate a desired implant ion species by ionization of a corresponding element, an acceleration tube configured to accelerate the ion species to a desired kinetic energy, a mass separator magnet and beam splitter configured to isolate a desired ion species, and a target chamber where the ion species may be directed to a surface of a semiconductor wafer. For example, a conventional Group-III nitride substrate, such as gallium nitride (GaN), may be doped with silicon to improve conductivity therein.

A common problem in conventional ion implantation may involve contamination in the implant region of the semiconductor wafer. For example, a foreign species or implant contaminant with the same particle weight as that of the desired implant species may be implanted along with the desired implant species in the ion implantation process. The implant contaminant may, for example, be present as a residual coating on the inner walls of the ion source chamber, and may be released due to heat used during the ionization process. As such, particles of the implant contaminant may be implanted into the substrate in place of the desired ion species, thereby reducing the desired ion concentration of the implant region. Moreover, because conventional mass spectrometry may be used to detect implant concentration based on particle weight, it may be difficult to determine the presence of implant contaminants in the substrate, and thus, the actual concentration of the desired ions in the implanted region. Accordingly, device performance may be detrimentally affected.

SUMMARY OF THE INVENTION

Embodiments of the present invention relate to ion implantation with reduced implant contamination. According to some embodiments of the present invention, a method of fabricating a semiconductor device includes selecting an element for implanting into a substrate. The element has at least a first isotope and a second isotope. For example, the selected element may be silicon (Si), the first isotope may be silicon-28, and the second isotope may be silicon-29. At least one implant contaminant is identified as having a particle weight that is substantially identical to an atomic weight of the first isotope of the element. For instance, nitrogen ($N_2$) may be identified as having a substantially similar molecular weight as the atomic weight of silicon-28. As such, ions of the second isotope of the element are selectively implanted into a region of the substrate. The second isotope has an atomic weight that is different from the particle weight of the at least one implant contaminant. For example, when the implant contaminant is nitrogen ($N_2$), the second isotope may be silicon-29 or silicon-30. Accordingly, the second isotope, rather than the first isotope, may be selectively implanted responsive to identifying the at least one contaminant. For example, the second isotope may be selectively implanted while substantially preventing implantation of the first isotope. In some embodiments, the implant contaminant may have resistive properties, and the selected element may have conductive properties.

In some embodiments, the first isotope may be a more naturally abundant isotope of the element, such as silicon-28, and the second isotope may be a less naturally abundant isotope of the element, such as silicon-29. As such, ions of a less naturally abundant isotope of the element may be selectively implanted into the substrate responsive to identifying a contaminant having a substantially identical particle weight as an ion of a more naturally abundant isotope of the element. The ions of the less naturally abundant isotope may have a different particle weight than the contaminant.

In other embodiments, the selected element may be silicon (Si), and the substrate may be gallium nitride (GaN). In addition, for example, the at least one implant contaminant may be boron fluoride (BF), the first isotope having the substantially identical particle weight may be silicon-30, and the second isotope having the different particle weight may be silicon-29.

In some embodiments, a presence of the at least one implant contaminant may be identified by comparing a natural abundance of the isotopes of the selected element to an actual isotope ratio therefor. The actual isotope ratio may be based on beam current measurements of the isotopes of the element generated during an ionization process.

In other embodiments, an ion concentration of the implanted region of the substrate may be verified based on the atomic weight of the second isotope that is different from the particle weight of the implant contaminant. For example, the ion concentration may be verified by detecting a presence of silicon-29 ions in the implanted region of the substrate using mass spectrometry.

According to further embodiments of the present invention, a method of implanting silicon (Si) ions into a gallium nitride (GaN) substrate includes identifying at least one implant contaminant having a particle weight that is substantially identical to an atomic weight of at least one isotope of silicon. For example, the at least one implant contaminant may be identified as nitrogen ($N_2$) and/or boron fluoride (BF). Silicon-29 is identified as an isotope of silicon having an atomic weight different from the particle weight of the implant contaminant, and silicon-29 ions are generated from an ion source. The silicon-29 ions are selectively implanted into a region of the gallium nitride substrate.

In some embodiments, generating the silicon-29 ions may include ionizing a solid and/or a gas containing silicon to produce a plurality of silicon ions. The plurality of silicon ions may include silicon-28 ions, silicon-29 ions, and/or silicon-30 ions.

In other embodiments, the silicon-29 ions may be selectively implanted by accelerating the plurality of silicon ions to a predetermined energy, isolating the silicon-29 ions from the plurality of silicon ions and/or the implant contaminant(s), and directing the silicon-29 ions to the region of the substrate. For example, the silicon-29 ions may be isolated by adjusting an ion beam including the plurality of silicon ions. More particularly, a magnetic field applied to the plurality of silicon ions may be altered to separate the silicon-28 and silicon-30 ions and the implant contaminant(s) from the silicon-29 ions. For example, the magnetic field may be altered by adjusting a mass separator magnet to isolate the silicon-29 ions from the plurality of silicon ions and/or the implant contaminant(s).

According to other embodiments of the present invention, a semiconductor device fabrication apparatus includes an ion implanter. The ion implanter is configured to selectively implant ions of a second isotope of a predetermined element into a substrate, responsive to identification of an implant contaminant having a substantially identical particle weight as a first isotope of the predetermined element. For example, the predetermined element may be silicon (Si), and the implant contaminant may be nitrogen ($N_2$). As such, the first isotope having the substantially identical particle weight may be silicon-28, and the second isotope having the different particle weight than the implant contaminant may be silicon-29 or silicon-30.

In some embodiments, the ion implanter may include an ion source, an acceleration tube, and a mass separator magnet. The ion source may be configured to provide a plurality of silicon ions, including silicon-28 ions, silicon-29 ions, and/or silicon-30 ions. The acceleration tube may be configured to accelerate the plurality of silicon ions to a predetermined energy, and the mass separator magnet may be configured to alter a magnetic field applied to the plurality of silicon ions to isolate the silicon-29 ions from the plurality of silicon ions and/or the implant contaminant.

According to still other embodiments of the present invention, a semiconductor device includes a Group-III nitride layer having an implant region therein. The implant region in the Group-III nitride layer contains silicon (Si), and has a nitrogen ($N_2$) contaminant concentration of less than that of an implant region containing silicon-28. For example, the implant region may include silicon-29. In addition, the implant region may have a nitrogen ($N_2$) contaminant concentration of less than about $1 \times 10^{16}$ cm$^{-3}$, which may be measured using mass spectrometry.

According to yet further embodiments of the present invention, a method of fabricating a semiconductor device includes forming a silicon-containing implant region in a Group-III nitride layer. The silicon-containing implant region has a nitrogen ($N_2$) contaminant concentration of less than about $1 \times 10^{16}$ cm$^{-3}$.

According to still further embodiments of the present invention, a semiconductor device includes an element therein having at least a first isotope and a second isotope. More particularly, the semiconductor device includes a substrate having an implant region therein containing the second isotope of the element. The second isotope of the element has an atomic weight that is different from a particle weight of at least one implant contaminant. The particle weight of the at least one implant contaminant is substantially identical to an atomic weight of the first isotope of the element.

According to some embodiments of the present invention, a semiconductor device includes a substrate and an implant region in the substrate. The implant region contains an element having a first isotope and a second isotope. A relative concentration of the first and second isotopes in the implant region is different than a natural abundance of the first and second isotopes of the element. For example, the first isotope may be a more naturally abundant isotope of the element, and the relative concentration of the second isotope may be greater than that of the first isotope in the implant region.

According to other embodiments of the present invention, a method of fabricating a semiconductor device includes providing an ion source that is configured to supply a plurality of ions of an element having at least two isotopes according to a natural abundance thereof. Ones of the plurality of ions are selectively implanted into a substrate such that a relative concentration of the at least two isotopes in the substrate is different than a relative concentration of the at least two isotopes in the plurality of ions. For example, the relative concentration of the second isotope in the substrate may be greater than that of the first isotope even where the first isotope is a more naturally abundant isotope of the element.

According to further embodiments of the present invention, a semiconductor device fabrication apparatus includes an ion implanter configured to selectively implant ones of a plurality of ions of an element having at least two isotopes into a substrate. The ones of the plurality of ions are selectively implanted such that a relative concentration of the at least two isotopes in the substrate is different than a relative concentration of the at least two isotopes in the plurality of ions. The relative concentration of the at least two isotopes in the plurality of ions corresponds to a natural abundance thereof. For example, a first isotope of the at least two isotopes may be a more naturally abundant isotope of the element, and the relative concentration of the second isotope in the substrate may be greater than that of the first isotope.

According to still further embodiments of the present invention, a semiconductor device includes a Group-III nitride layer and an implant region in the Group-III nitride layer. The implant region contains silicon (Si), and has a silicon-29 concentration of greater than that of a silicon-28 concentration therein.

According to yet further embodiments of the present invention, a method of fabricating a semiconductor device includes forming a silicon-containing implant region in a Group-III nitride layer. The silicon-containing implant region has a silicon-29 concentration greater than that of a silicon-28 concentration therein.

These and other features of the present invention will become more readily apparent to those skilled in the art upon consideration of the following detailed description and accompanying drawings, which describe both preferred and alternative embodiments of the present invention.

DETAILED DESCRIPTION OF EMBODIMENTS OF THE INVENTION

Figure 1:
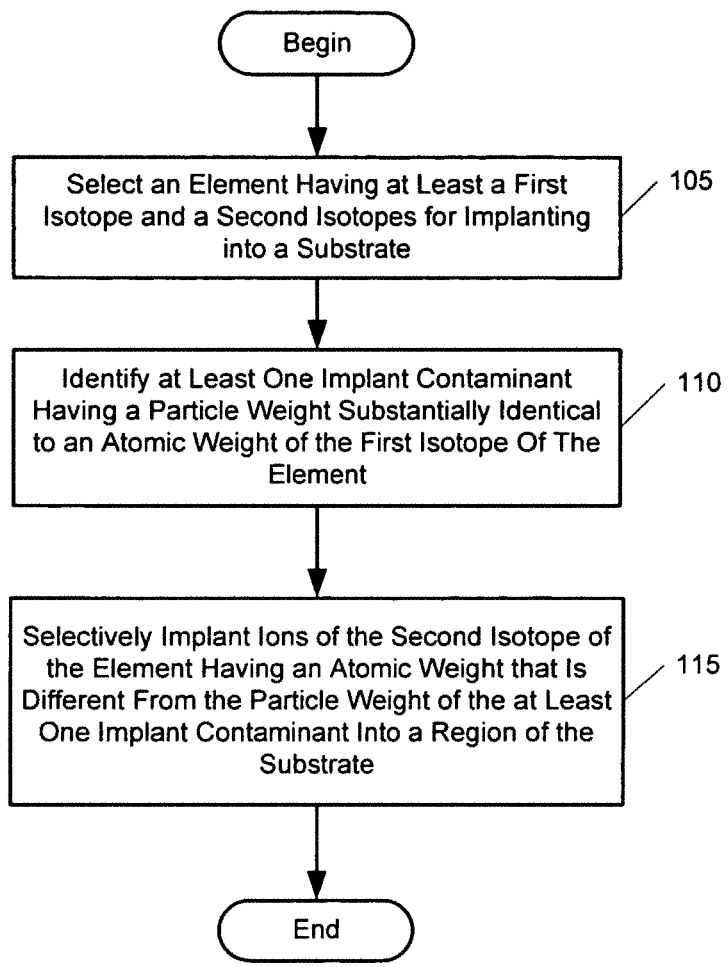
FIG. 1 is a flowchart illustrating operations for fabricating semiconductor devices according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

Some embodiments of the present invention may be particularly well suited for use in Group III-nitride based devices. As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary compounds such as AlGaN and AlInGaN. As is well understood by those in this art, the Group III elements can combine with nitrogen to form binary (e.g., GaN), ternary (e.g., AlGaN, AlInN), and quaternary (e.g., AlInGaN) compounds. These compounds may all have empirical formulas in which one mole of nitrogen is combined with a total of one mole of the Group III elements.

Some embodiments of the present invention may arise from a realization that, in ion implantation, implant contamination may be reduced by adjusting the ion beam to selectively implant an ion species with a different mass than common and/or identified contaminants. Accordingly, some embodiments of the present invention describe selectively implanting a desired region of a Group-III nitride semiconductor device using a silicon-29 ion species, as will be described in detail below.

FIG. 1 is a flowchart illustrating exemplary operations for fabricating semiconductor devices according to some embodiments of the present invention. Referring now to FIG. 1, an element is selected for implanting into a substrate at block 105. The element has at least a first isotope and a second isotope. As used herein, isotopes refers to forms of an element whose nuclei include the same number of protons, but a different number of neutrons. As such, although isotopes of an element have the same atomic number, they have a different atomic weight. The atomic weight or atomic mass of an isotope is the mass of the isotope relative to that of carbon-12 (which has an atomic weight of 12), based on the sum of the number of neutrons and protons in each nucleus. The first isotope may be a more naturally abundant isotope of the element, while the second isotope may be a less naturally abundant isotope of the element. For example, in some embodiments of the present invention, the selected element may be silicon (Si), the first isotope may be silicon-28 (having an atomic weight of 27.98), and the second isotope may be silicon-29 (having an atomic weight of 28.98). Also, the substrate may be a Group III-nitride layer, such as GaN.

Still referring to FIG. 1, at least one implant contaminant having a particle weight that is substantially identical to an atomic weight of the first isotope of the element is identified at block 110. As used herein, the term "particle weight" may refer to the weight of one atom of an element (i.e., atomic weight), or to the weight of one molecule of an element (i.e., molecular weight), and may be expressed in atomic mass units (amu). For example, when the selected element is silicon, nitrogen ($N_2$) may be identified as the implant contaminant. The nitrogen ($N_2$) may be present as a residual coating on the ion source chamber walls, and may be released, for example, due to heat during an ionization process. The presence of the nitrogen ($N_2$) molecules may interfere with the implantation of silicon-28 ions, which may be commonly used in ion implantation as silicon-28 is the most abundant isotope of silicon. Such mass interferences may occur whenever another atom/molecule has the same mass as the desired ion to be implanted. More specifically, mass interference may occur because a singly-ionized nitrogen ($N_2$) molecule (having a particle weight of 28.0) has a substantially identical mass as a silicon-28 ion (having a particle weight of 27.98). As such, nitrogen ($N_2$) molecules may be undesirably implanted into the substrate in place of silicon-28 ions. Moreover, in a gallium nitride (GaN) substrate, implanting silicon may provide increased conductivity, while implanting nitrogen ($N_2$) may provide increased resistance. As such the implanted nitrogen ($N_2$) may increase resistivity of the implanted region, thereby reducing the desired conductivity of the implant region and defeating a purpose of the ion implantation.

Accordingly, at block 115, ions of the second isotope of the element, which have an atomic weight that is different from the particle weight of the identified contaminant, are selectively implanted into a region of the substrate. For example, ions of a less naturally abundant isotope of the element may be selectively implanted into the substrate responsive to identifying a contaminant having a substantially identical particle weight as an ion of a more naturally abundant isotope of the element. More particularly, responsive to identifying nitrogen ($N_2$) as a contaminant, silicon-29 (having an atomic weight of 28.98) or silicon-30 (having an atomic weight of 29.97) ions may be selectively implanted into the substrate instead of the silicon-28 ions, as both of these isotopes have a different atomic weight than the particle weight of nitrogen ($N_2$). As such, implantation of an identified contaminant, such as nitrogen ($N_2$), can be reduced and/or avoided based on the weight of the contaminant. Moreover, since all of the isotopes of an element may have the same chemical properties, ionization and detection efficiencies may remain nearly constant for the different isotopes.

Figure 2:
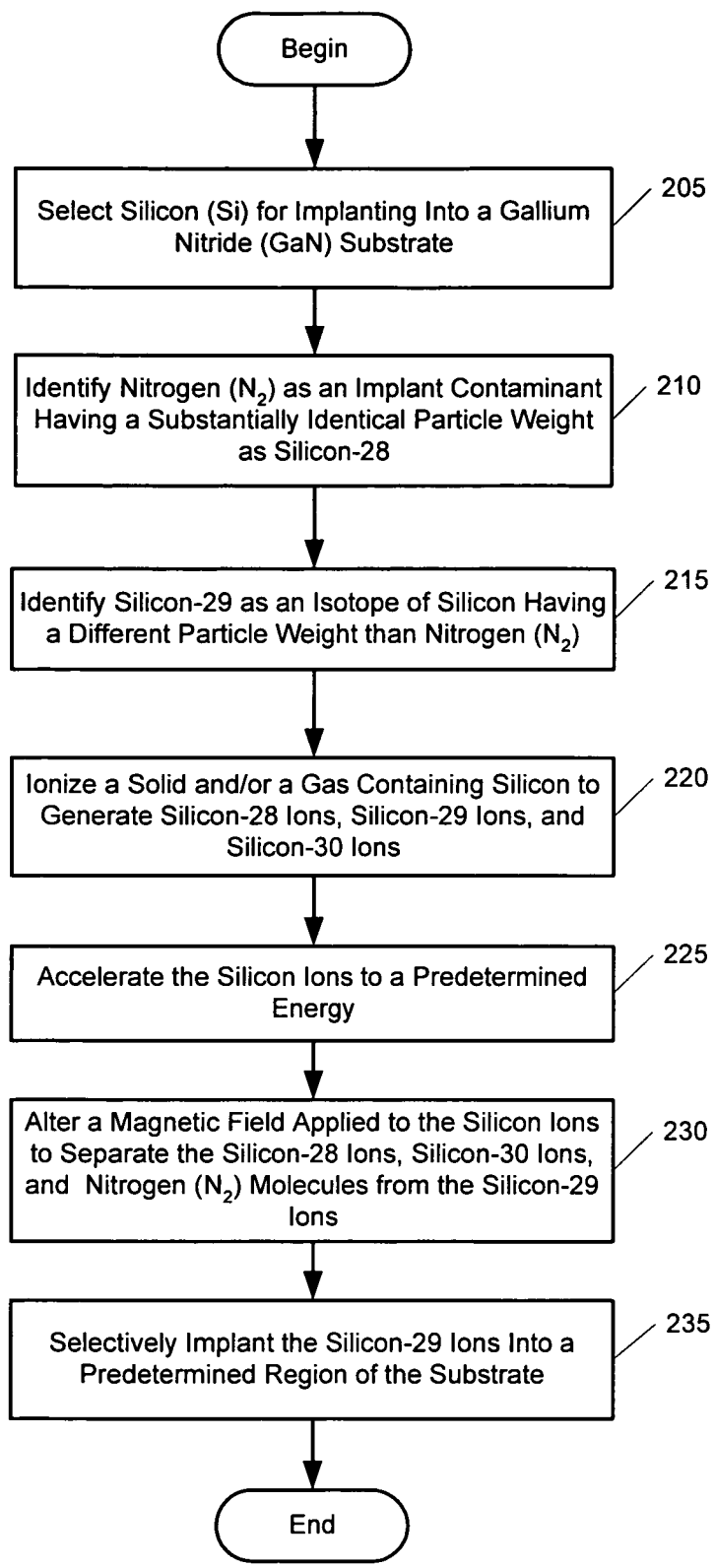
FIG. 2 is a flowchart illustrating operations for fabricating semiconductor devices according to further embodiments of the present invention.

FIG. 2 is a flowchart illustrating operations for fabricating semiconductor devices according to further embodiments of the present invention. Referring now to FIG. 2, silicon (Si) is selected for implanting into a gallium nitride (GaN) substrate at block 205. As mentioned above, gallium nitride may be doped with silicon ions to achieve a desired conductivity in the implanted region. For example, silicon ions may be implanted to provide n-type ohmic contact regions in the gallium nitride substrate.

At block 210, nitrogen ($N_2$) is identified as an implant contaminant having a particle weight that is substantially identical to an atomic weight of one of the isotopes of silicon. More particularly, conventional n-type implanting of Group-III nitride films, such as gallium nitride, may use silicon-28 ions as the implant species. Silicon-28 is the most naturally abundant isotope of silicon. However, because nitrogen ($N_2$) molecules have a substantially similar molecular weight (28.0 amu) as the atomic weight of silicon-28 ions (27.98 amu), an ion implanter device that operates based on element weight may be unable to distinguish between the two particles. As such, some nitrogen ($N_2$) molecules may be implanted during implantation of silicon-28 ions, thereby contaminating the implant region. Moreover, the implanted nitrogen may increase the resistance of the implanted region, thereby reducing the desired conductivity.

Accordingly, at block 215, silicon-29 is identified as an isotope of silicon having an atomic weight (28.98 amu) that is different from the molecular weight of nitrogen ($N_2$). It should be noted that silicon-30 also has an atomic weight (29.07 amu) that is different from the particle weight of nitrogen ($N_2$); however, boron fluoride (BF) may be identified as a contaminant having a substantially identical mass (29.81 amu). In contrast, no contaminants have been identified as having a substantially identical particle weight as silicon-29.

After identifying silicon-29 as an appropriate isotope of silicon for ion implantation to reduce and/or avoid mass interference with nitrogen ($N_2$) and/or other implant contaminants, silicon-29 ions are generated from an ion source. More particularly, at block 220, a solid and/or a gas containing silicon is ionized to generate silicon-28 ions, silicon-29 ions, and/or silicon-30 ions. For example, the silicon ions may be generated by ionizing a silicon solid and/or silicon fluoride ($SiF_4$) gas by a number of ionization methods, as are well-known in the art. However, heat from the ionization process may release nitrogen ($N_2$) that may be present, for example, on walls of the ion source chamber. The presence of nitrogen ($N_2$) may be determined by comparing a theoretical isotope ratio for silicon to an actual isotope ratio, for example, based on beam current measurements of the isotopes of the silicon generated during the ionization process.

Still referring to FIG. 2, the silicon ions are accelerated to a predetermined energy at block 225. The predetermined energy may be based on a desired implantation depth and/or a desired peak ion concentration for the implanted region of the substrate. The silicon-29 ions are then isolated from the silicon-28 ions the silicon-30 ions, and/or the nitrogen ($N_2$) molecules, for example, by adjusting an ion beam containing the silicon ions to separate out any particles not having a particle weight of approximately 29 amu. More particularly, at block 230, a magnetic field applied to the silicon ions is altered to separate the silicon-28 and silicon-30 ions and the nitrogen ($N_2$) molecules from the silicon-29 ions. For example, the magnetic field may be altered by adjusting a mass separator magnet to isolate the silicon-29 ions from the other particles. Accordingly, the silicon-29 ions are directed to a desired region of the gallium nitride substrate and are selectively implanted therein at block 235. As all particles that do not have a particle weight of approximately 29 amu are filtered out at block 230, common contaminants of a different particle weight, such as nitrogen ($N_2$) (28.0 amu) and/or boron fluoride (BF) (29.81 amu), are not implanted. Moreover, as no contaminants have been identified as having a particle weight of approximately 29 amu, contamination in the implanted region may be reduced.

In some embodiments of the present invention, an ion concentration of the implanted region of the substrate may be verified based on the atomic weight of the implanted isotope. For example, with reference to the operations of FIG. 2, a presence of silicon-29 ions may be detected in the implanted region of the substrate using mass spectrometry based on the difference in particle weight of the implant contaminants.

As is well-known in the art, mass spectrometry is an analytical technique used to measure the mass-to-charge ratio (m/z) of ions to determine the composition of a physical sample, based on generation of a mass spectrum representing the masses of the components of a sample. Secondary Ion Mass Spectrometry (SIMS) is a type of mass spectrometry that may use a highly focused ion beam that 'sputters' material from a selected domain on a sample surface. The 'secondary ions' which are ejected/emitted from this sample may be passed through a mass spectrometer, which may separate the ions according to their mass/charge ratio to provide a chemical analysis of a very small sampling volume. Accordingly, an ion concentration of a nitride-III film implanted with silicon-29 ions may be verified by secondary ion mass spectrometry (SIMS).

Mass spectrometry may also be used to determine the isotopic composition of elements within a sample, which may be helpful in determining a presence of contaminants. More specifically, to determine the relatively small differences in mass among isotopes of an element a magnet may be used to bend a beam of ionized particles towards a series of faraday cups, which may convert particle impacts to electric current. A faraday cup is a metal (conductive) cup meant to re-catch secondary particles. When an ion beam hits the metal, it will be charged while the ions are neutralized. The metal can then be discharged to measure a small current equivalent to the number of discharged ions. By measuring the electrical current, the number of charges being carried by the ions can be determined. As such, based on beam current measurements of the isotopes of the element generated during an ionization process, an actual isotope ratio may be determined. A presence of at least one implant contaminant may then be identified by comparing a theoretical isotope ratio for the element to the actual isotope ratio. More particularly, an actual isotope ratio that is greater than the theoretical ratio for that isotope may indicate the presence of a contaminant having a substantially identical particle weight, as will be further discussed below with reference to the Example below.

Figure 3:
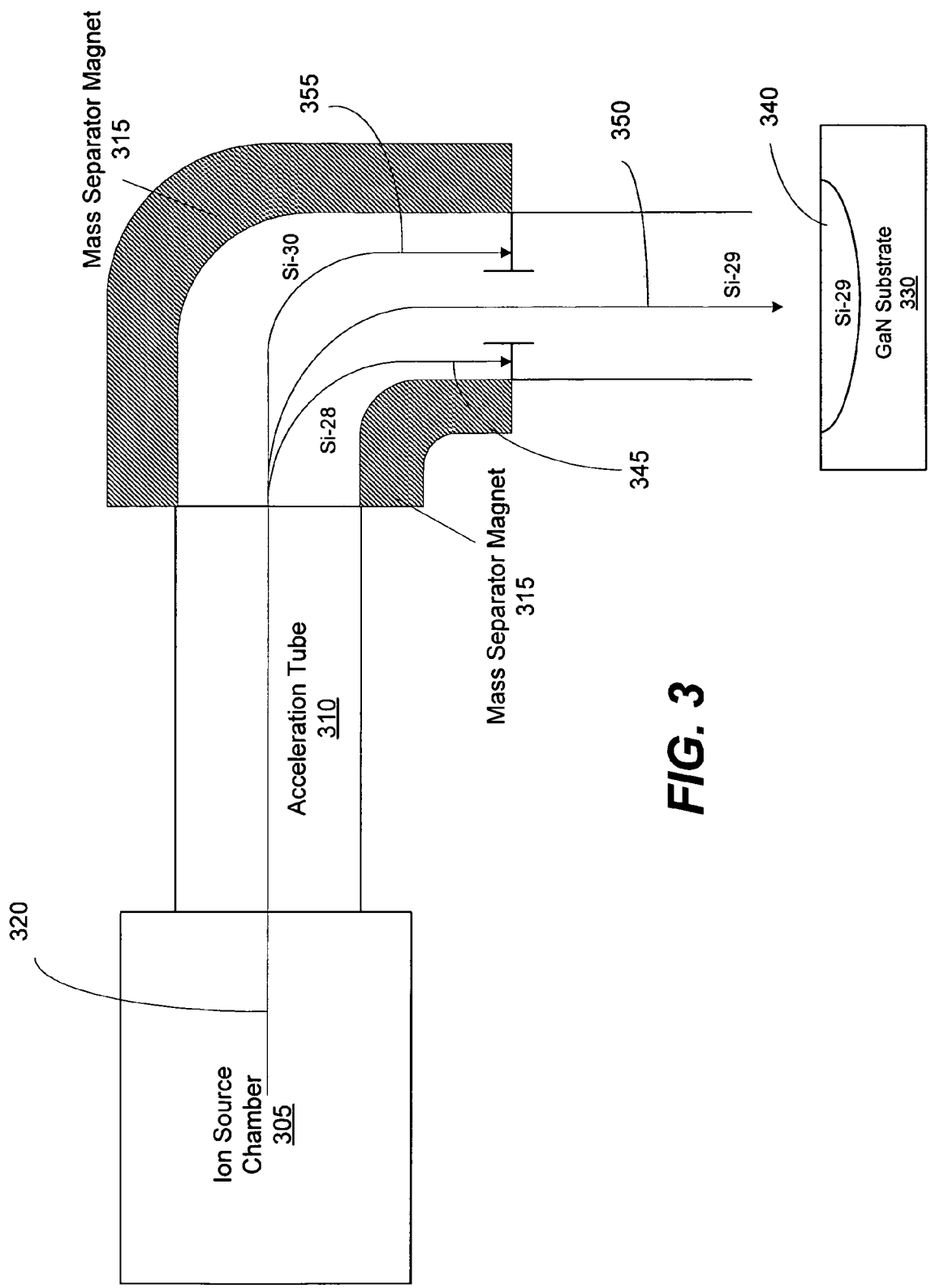
FIG. 3 is a block diagram illustrating a semiconductor device fabrication apparatus according to some embodiments of the present invention.

FIG. 3 is a block diagram illustrating an ion implanter 300 according to some embodiments of the present invention. Referring now to FIG. 3, the ion implanter 300 includes an ion source chamber 305, an acceleration tube 310, and a mass separator magnet 315. The ion implanter 300 is configured to selectively implant ions of a second isotope of a predetermined element into a substrate, responsive to identification of an implant contaminant having a substantially identical particle weight as a first isotope of the predetermined element. The second isotope has a different particle weight than the implant contaminant. As such, possible contaminants can be separated from the ions of the second isotope prior to implantation, thereby reducing contamination of the implanted region. For example, when the predetermined element is silicon (Si), the ion implanter 300 may be configured to selectively implant a less naturally abundant isotope of silicon (such as silicon-29) responsive to identifying a contaminant having a substantially identical particle weight as a more naturally abundant isotope of silicon (such as silicon-28).

More specifically, referring to FIG. 3, silicon (Si) is selected as the predetermined element for implanting into a gallium nitride substrate 330. Nitrogen ($N_2$) and/or boron fluoride (BF) may be identified as possible implant contaminants. The nitrogen ($N_2$) and/or boron fluoride (BF) may be present, for example, as a residual coating on the walls of the ion source chamber 305. As such, silicon-29 may be identified as an isotope of silicon having a different particle weight (28.98 amu) than nitrogen ($N_2$) (28.0 amu) and/or boron fluoride (BF) (29.81 amu). Accordingly, the ion source chamber 305 is configured to provide a plurality of silicon ions 320. More particularly, the ion source chamber 305 may be configured to provide silicon-28 ions 345, silicon-29 ions 350, and silicon-30 ions 355, by ionizing a solid and/or a gas containing silicon, such as silicon fluoride ($SiF_4$) gas, using any of a number of ionization methods as are well-known in the art. Also, during the ionization process, nitrogen ($N_2$), boron fluoride (BF) and/or other implant contaminants may be released from the walls of the ion source chamber 305, due to heat from the ionization process.

Still referring to FIG. 3, the acceleration tube 310 is configured to accelerate the plurality of silicon ions 320 to a predetermined kinetic energy level. The predetermined kinetic energy level may be based on a desired implantation depth and/or a desired peak ion concentration for an implant region 340 in the gallium nitride substrate 330. The mass separator magnet 315 is configured to isolate the silicon-29 ions 350 from the plurality of ions 320 and/or the implant contaminant(s) based on the atomic weight of silicon-29 (approximately 29 amu). More specifically, the mass separator magnet 315 is configured to alter a magnetic field applied to the plurality of silicon ions 320 to separate the silicon-28 and silicon-30 ions 345 and 355 from the silicon-29 ions 350, as well as any other particles that do not have a substantially identical particle weight as the silicon-29 ions 350. As such, only the silicon-29 ions 350 are implanted into the gallium nitride substrate 330 to provide the implant region 340. As discussed above, the silicon-29 ions 350 may be implanted to provide a desired conductivity in the implant region 340. Moreover, as the mass separator magnet 315 is configured to separate out particles other than those having a particle weight of approximately 29 amu, implantation of common contaminants, such as nitrogen ($N_2$) (28.0 amu) and/or boron fluoride (BF) (29.81 amu), may be reduced and/or prevented.

Accordingly, as shown in FIG. 3, the gallium nitride (GaN) substrate 330 includes an implant region 340 containing silicon (Si), but with a lower nitrogen ($N_2$) contaminant concentration than that of a conventional implant region. For example, a conventional region implanted with silicon-28 ions may have a nitrogen ($N_2$) contaminant concentration of about $5 \times 10^{19}$ $cm^{-3}$, which may be measured using mass spectroscopy. However, the implant region 340 implanted with silicon-29 ions may have a nitrogen ($N_2$) contaminant concentration of less than about $1 \times 10^{16}$ $cm^{-3}$. Thus, contamination in an implanted silicon region 340 of a gallium nitride substrate 330 may be reduced according to some embodiments of the present invention.

Some embodiments of the present invention may employ semiconductor fabrication methods discussed in currently commonly assigned U.S. patent application Ser. No. 11/434,853 entitled SEMICONDUCTOR DEVICES INCLUDING SELF ALIGNED REFRACTORY CONTACTS AND METHODS OF FABRICATING THE SAME, filed concurrently herewith, the disclosure of which is hereby incorporated herein by reference as if set forth in its entirety.

Additional embodiments of the present invention will now be described with reference to the following example.

EXAMPLE

A gallium nitride (GaN) substrate was implanted with silicon-29 ions, rather than with silicon-28 ions, to reduce and/or avoid contamination by nitrogen ($N_2$), which has a molecular weight that is substantially identical to the atomic weight of silicon-28. Silicon-28 is the most abundant isotope of silicon (Si), and may be conventionally used in doping gallium nitride substrates in order to increase conductivity, for example, to provide ohmic contacts therein. Table 1 illustrates the theoretical isotope ratio for the three isotopes of silicon based on their natural abundance, and the corresponding isotope mass. As used herein, the term 'natural abundance' may refer to the relative concentrations or prevalence of different isotopes of an element as found in nature.

TABLE 1

| Si Isotopes | Isotope Mass (amu) | Theoretical Isotope Ratio |
| --- | --- | --- |
| Silicon-28 | 27.98 | 92.21% |
| Silicon-29 | 28.98 | 4.70% |
| Silicon-30 | 29.97 | 3.09% |

The presence of a contaminant was determined by comparing the theoretical isotope ratio for silicon with actual isotope ratios. The actual isotope ratios were determined based on beam current measurements of actual silicon isotopes generated during an ionization process. More particularly, a magnet was used to bend a beam of ionized silicon particles towards a series of faraday cups, to convert particle impacts to electric current, which was measured to determine the beam currents for each isotope of silicon. The actual isotope ratios were calculated based on the respective ratios of the measured beam currents for each isotope relative to the sum of the measured beam currents. The actual isotope ratio for the three isotopes of silicon, along with the corresponding measured beam currents, are provided in Table 2.

TABLE 2

| Praticle Weight | Measured Beam Current | Actual Isotope Ratio |
|---|---|---|
| 28 | 120 μA | 93.8% |
| 29 | 5 μA | 3.9% |
| 30 | 3 μA | 2.3% |

As shown in Table 2, the actual isotope ratio for silicon-28 is higher than the theoretical ratio, indicating the presence of a contaminant having a substantially identical particle weight as that of the atomic weight of silicon-28 (27.98 amu). More particularly, nitrogen ($N_2$), having a molecular weight of 28.0 amu, is the most likely contaminant. As such, when silicon-28 is used in ion implantation, nitrogen ($N_2$) may occupy some of the impurity sites of the implant region in place of silicon-28. This may result in increasing the resistivity of the gallium nitride film, contrary to the purpose of implanting silicon ions into gallium nitride, i.e., to increase conductivity. However, no contaminants having a particle weight of approximately 29 amu have been discovered.

Accordingly, silicon-29 was isolated and implanted into the gallium nitride (GaN) substrate by adjusting the mass separator magnet of the ion implanter to prevent implantation of particles that do not have an atomic weight of approximately 29 amu. As such, nitrogen ($N_2$) was prevented from competing with the silicon-29 ions for doping sites, thereby increasing the conductivity of the implanted region.

Figure 4:
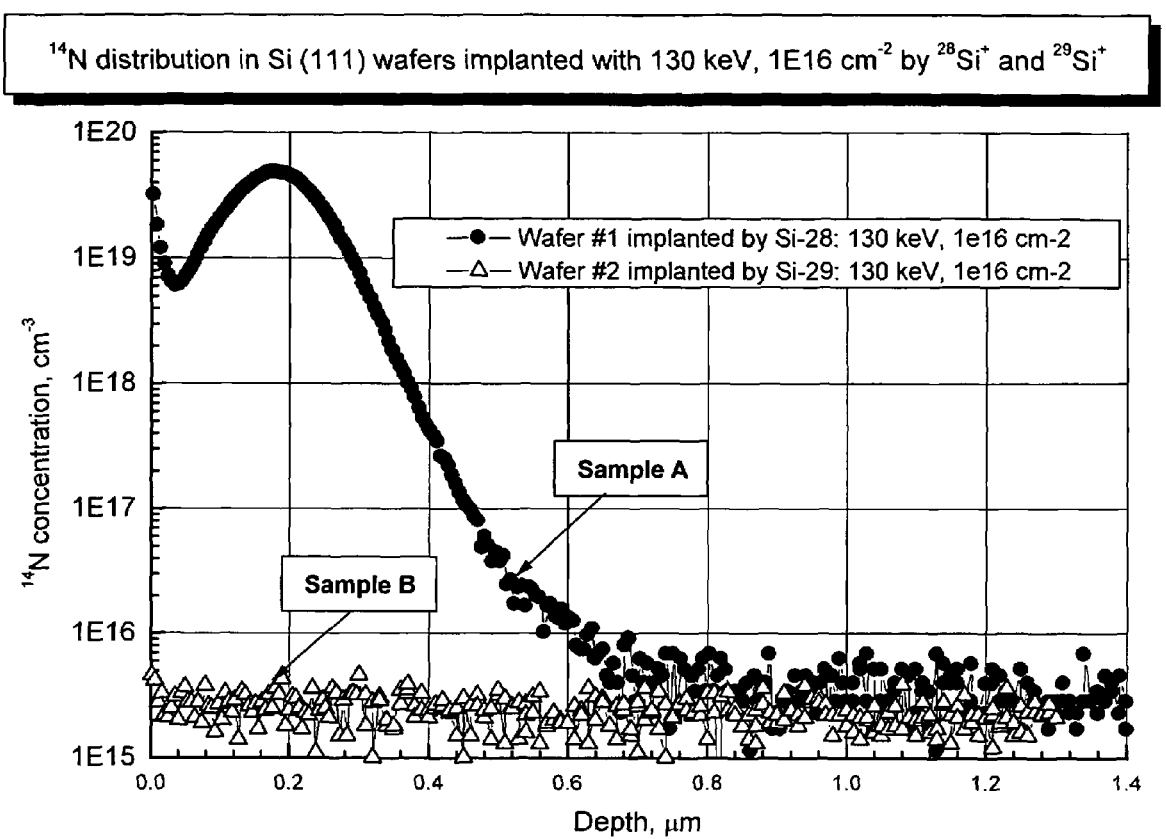
FIG. 4 is a graph illustrating implant contaminant concentration in a silicon wafer implanted according to conventional

FIG. 4 illustrates the nitrogen distribution in regions of a silicon substrate implanted with silicon-28 ions as compared to that of a silicon substrate implanted with silicon-29 ions. A silicon substrate was used to more easily illustrate nitrogen contamination due to the implantation process, which may be more difficult to detect in a nitride-based layer. However, it is to be understood that such implantation may be effective in any Group-III nitride based device or Group-III nitride layer with n-type implanted regions.

More particularly, FIG. 4 is a graph based on experimental SIMS data illustrating nitrogen-14 distribution in silicon wafers implanted with silicon-28 and silicon-29 ions at a dose of $1 \times 10^{16}$ cm$^{-2}$ and with an implantation energy of 130 keV. As shown in FIG. 4, the nitrogen contaminant concentration of a region of the silicon substrate implanted with a silicon-28 ion species (sample A) is greater than the nitrogen contaminant concentration of a region of the silicon substrate implanted with a silicon-29 ion species (sample B), particularly at depths of less than about 0.6 micrometers (μm). Thus, FIG. 4 illustrates that the nitrogen contaminant concentration may be reduced by selectively implanting silicon-29 ions, which have a different particle weight than the nitrogen contaminant.

The resistivity of regions of a gallium nitride substrate conventionally implanted with silicon-28 ions as compared to that of a gallium nitride substrate implanted with silicon-29 ions using methods according to some embodiments of the present invention is illustrated in Table 3.

TABLE 3

| GaN Sample | Implanted ions | Contact resistance, Ohm - mm | Sheet resistance, Ohm/sq | Implant conditions |
|---|---|---|---|---|
| Sample A | Si-28 | 0.29 | 128.78 | 130 keV, $4 \times 10^{15}$ cm$^{-2}$ |
| Sample B | Si-29 | 0.19 | 80.12 | 130 keV, $4 \times 10^{15}$ cm$^{-2}$ |

As shown in Table 3, even though both samples were implanted with the same dose of silicon ions and using the same implantation energy, both the contact resistance and the sheet resistance of the gallium nitride substrate implanted with a silicon-28 ion species (sample A) are greater than that of the gallium nitride substrate implanted with a silicon-29 ion species (sample B). The increased resistivity of sample A may be due to the presence of contaminants, such as nitrogen ($N_2$), which have a substantially similar particle weight as the silicon-28 ions. Accordingly, as illustrated in FIG. 4 and Table 3, ion implantation of gallium nitride substrates using silicon-29 ions according to some embodiments of the present invention may provide reduced implant contamination and increased conductivity.

Thus, in some embodiments of the present invention, ions of a one isotope of an element may be selectively implanted into the substrate responsive to identifying a contaminant having a substantially identical particle weight as an ion of another isotope of the element. As the particle weight of the implanted ions may be different from the particle weight of the contaminant, contamination in the implanted region may be reduced and/or avoided.

In the drawings and specification, there have been disclosed typical embodiments of the invention, and, although specific terms have been employed, they have been used in a generic and descriptive sense only and not for purposes of limitation.

That which is claimed is:

1. A method of fabricating a semiconductor device, the method comprising:
   selecting an element for implanting into a substrate, the element having at least a first isotope and a second isotope;
   identifying a presence of at least one implant contaminant by comparing a theoretical isotope ratio for the element to an actual isotope ratio for the element calculated from beam current measurements of the isotopes of the element generated during an ionization process; and
   selectively implanting ions of the second isotope of the element into a region of the substrate responsive to identifying the presence of the at least one implant contaminant, wherein the first isotope has an atomic weight that is substantially identical to a particle weight of the at least one identified implant contaminant, and wherein the second isotope has an atomic weight that is different from the particle weight of the at least one implant contaminant.

2. The method of claim 1, wherein the first isotope comprises a more naturally abundant isotope of the element, and wherein the second isotope comprises a less naturally abundant isotope of the element.

3. The method of claim 1, wherein the selected element comprises silicon (Si), and wherein the substrate comprises a Group-III nitride.

4. The method of claim 3, wherein the at least one implant contaminant comprises nitrogen ($N_2$), wherein the first isotope comprises silicon-28, and wherein the second isotope comprises silicon-29 or silicon-30.

5. The method of claim 3, wherein the at least one implant contaminant comprises boron fluoride (BF), wherein the first isotope comprises silicon-30, and wherein the second isotope comprises silicon-29.

6. The method of claim 1, further comprising:
verifying an ion concentration of the implanted region of the substrate based on the atomic weight of the second isotope that is different from the particle weight of the implant contaminant.

7. The method of claim 6, wherein verifying the ion concentration comprises:
detecting a presence of silicon-29 ions in the implanted region of the substrate using mass spectrometry.

8. A method of implanting silicon (Si) ions into a gallium nitride (GaN) substrate, the method comprising:
generating a plurality of silicon ions comprising silicon-28 ions, silicon-29 ions, and/or silicon-30 ions from an ion source;
identifying at least one implant contaminant having a particle weight that is substantially identical to an atomic weight of at least one isotope of silicon by comparing a theoretical isotope ratio for silicon to an actual isotope ratio for silicon calculated from beam current measurements using the plurality of silicon ions generated from the ion source;
identifying silicon-29 as an isotope of silicon having an atomic weight different from the particle weight of the at least one implant contaminant; and
selectively implanting the silicon-29 ions into a region of the gallium nitride substrate responsive to identifying the implant contaminant.

9. The method of claim 8, wherein generating the plurality of silicon ions comprises:
ionizing a solid and/or a gas containing silicon to produce the plurality of silicon ions comprising silicon-28 ions, silicon-29 ions, and/or silicon-30 ions.

10. The method of claim 9, wherein selectively implanting comprises:
accelerating the plurality of silicon ions to a predetermined energy;
isolating the silicon-29 ions from the plurality of silicon ions and/or the at least one implant contaminant; and
directing the silicon-29 ions to the region of the substrate.

11. The method of claim 10, wherein isolating the silicon-29 ions comprises:
adjusting an ion beam comprising the plurality of silicon ions to isolate the silicon-29 ions therefrom.

12. The method of claim 11, wherein adjusting the ion beam comprises:
altering a magnetic field applied to the plurality of silicon ions to separate the silicon-28 and silicon-30 ions from the silicon-29 ions.

* * * * *